(12) United States Patent
Sakuma et al.

(10) Patent No.: US 9,065,049 B2
(45) Date of Patent: Jun. 23, 2015

(54) THIN FILM PIEZOELECTRIC DEVICE

(71) Applicant: TDK CORPORATION, Tokyo (JP)

(72) Inventors: Hitoshi Sakuma, Tokyo (JP); Yasuhiro Aida, Tokyo (JP); Katsuyuki Kurachi, Tokyo (JP); Kazuhiko Maejima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 441 days.

(21) Appl. No.: 13/624,573

(22) Filed: Sep. 21, 2012

(65) Prior Publication Data

US 2014/0084749 A1    Mar. 27, 2014

(51) Int. Cl.
| | |
|---|---|
| *H01L 41/187* | (2006.01) |
| *H01L 41/18* | (2006.01) |
| *H01L 41/08* | (2006.01) |
| *H01L 41/316* | (2013.01) |
| *G01C 19/5621* | (2012.01) |
| *G01C 19/5628* | (2012.01) |

(52) U.S. Cl.
CPC ............ *H01L 41/18* (2013.01); *H01L 41/0805* (2013.01); *H01L 41/1873* (2013.01); *H01L 41/316* (2013.01); *G01C 19/5621* (2013.01); *G01C 19/5628* (2013.01)

(58) Field of Classification Search
USPC .................. 310/311, 328, 358, 365
See application file for complete search history.

(56) References Cited

U.S. PATENT DOCUMENTS

| | | | |
|---|---|---|---|
| 6,404,603 B1 | 6/2002 | Inoue et al. | |
| 2006/0066180 A1 | 3/2006 | Nanataki et al. | |
| 2010/0320871 A1 | 12/2010 | Suenaga et al. | |
| 2011/0260578 A1* | 10/2011 | Bharti et al. | 310/314 |
| 2012/0056508 A1* | 3/2012 | Horikiri et al. | 310/317 |

FOREIGN PATENT DOCUMENTS

| | | |
|---|---|---|
| EP | 1 965 450 A2 | 9/2008 |
| JP | A-2000-113427 | 4/2000 |
| JP | A-2011-029591 | 2/2011 |
| WO | WO 2011/102329 A1 | 8/2011 |

OTHER PUBLICATIONS

Jan. 30, 2014 Written Opinion issued in International Application No. PCT/IB2013/002388.
Jan. 30, 2014 Search Report issued in International Application No. PCT/IB2013/002388.
Mar. 24, 2015 International Preliminary Report on Patentability issued in PCT/IB2013/002388.

* cited by examiner

*Primary Examiner* — Thomas Dougherty
(74) *Attorney, Agent, or Firm* — Oliff PLC

(57) ABSTRACT

A thin film piezoelectric device according to the present invention includes a pair of electrode layers and a piezoelectric thin film interposed between the pair of electrode layers, wherein the piezoelectric thin film contains a rare gas element and has a content gradient of the rare gas element in the thickness direction of the piezoelectric thin film.

6 Claims, 4 Drawing Sheets

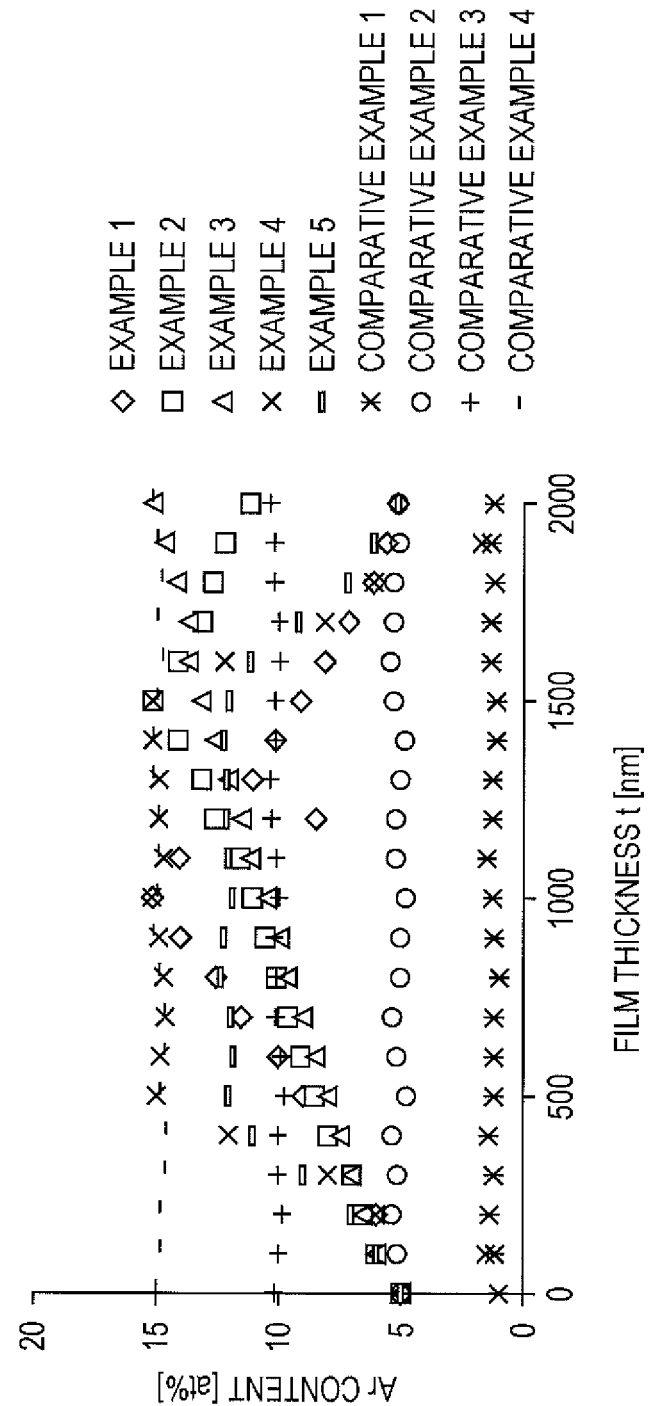

THIN FILM PIEZOELECTRIC DEVICE

BACKGROUND OF INVENTION

1. Technical Field

The present invention relates to a thin film piezoelectric device using a thin film piezoelectric material.

2. Background Art

In recent years, thin film piezoelectric devices using thin film piezoelectric materials instead of using bulk piezoelectric materials have been increasingly put into practical use. Examples of the devices include a gyrosensor, a shock sensor, a microphone, etc., which utilize the piezoelectric effect of converting the force applied to a piezoelectric film into voltage, an actuator, an ink jet head, a speaker, a buzzer, a resonator, etc., which utilize the inverse piezoelectric effect of deforming a piezoelectric film by applying a voltage to the piezoelectric film, and the like.

Use of piezoelectric material thin films can reduce the sizes of devices and thus extend the applicable field, and also permits the batch production of many devices on a substrate, thereby increasing mass productivity. In addition, when sensors are manufactured, the sensors have many advantages in performance, such as an improvement in sensitivity. However, in comparison with bulk materials, thin film materials have large influences on piezoelectric characteristics by the coefficients of thermal expansion of the other layers constituting a device, film physical properties such as Young's modulus, external stress introduced from the other layers, and internal stress possessed by a piezoelectric film, and thus a stress control technique different from that for bulk materials is required. Therefore, a method for controlling piezoelectric characteristics by a stress control technique for piezoelectric films becomes an important factor in designing a thin film piezoelectric device.

PATENT LITERATURE

[PTL 1] Japanese Unexamined Patent Application Publication No. 2000-113427

[PTL 2] Japanese Unexamined Patent Application Publication No. 2011-029591

SUMMARY OF INVENTION

One of the important factors of piezoelectric characteristics is coercive electric field Ec. The coercive electric field Ec represents a value of electric field with which spontaneous polarization is reversed, and the polarization direction starts to be reversed by applying an electric field equal to or higher than this electric field to a piezoelectric material. FIG. 1 illustrates a hysteresis curve of polarization P versus electric field E of a typical piezoelectric device and positions of coercive electric field Pc. In a device utilizing the inverse piezoelectric effect, i.e., utilizing deformation of a piezoelectric thin film when a voltage is applied thereto, a high displacement is obtained in the same direction as the polarization direction.

FIG. 2 illustrates a relation (hereinafter referred to as a "butterfly curve") between amount of distortion x and electric field E of a typical piezoelectric device. FIG. 2 reveals that the distortion direction is reversed at coercive electric field Ec as a boundary. That is, even when the electric field E is increased for achieving a large amount of distortion x, the polarization direction is reversed at the moment of exceeding the coercive electric field Ec, and an amount of distortion x in a desired direction cannot be achieved. Therefore, in order to achieve a large amount of distortion x, a piezoelectric device having large coercive electric field Ec is desired.

Methods for increasing the coercive electric field include a method of changing a composition of a piezoelectric thin film, a method of controlling external stress due to a film structure, a method of controlling internal stress by controlling the film deposition conditions of the piezoelectric thin film, and the like.

When a composition of a piezoelectric thin film is changed to further increase the coercive electric field, a piezoelectric constant tends to be decreased, thereby causing difficulty in achieving a displacement. When external stress is controlled by applying a stress control layer or the like including a film which is adjustable for an amount of distortion by controlling deposition conditions and the film thickness and which is in direct or indirect contact with a piezoelectric thin film to control an amount of distortion of the piezoelectric thin film, the number of constituent layers is increased, thereby increasing the manufacturing cost of a thin film piezoelectric device.

In regard to control of internal stress, the stress is controlled by controlling film deposition conditions, such as a partial pressure of reactive gas used for forming a piezoelectric thin film, a film deposition rate, output of an applied power source, etc., and thus the coercive electric field can be increased, but a piezoelectric constant may also be changed. When the piezoelectric thin film contains inert gas, internal stress occurs in the piezoelectric thin film, but the inert gas does not react with the composition elements constituting the piezoelectric thin film, producing little influence on a change in piezoelectric constant. However, the internal stress can be produced by changing the partial pressure of reactive gas or the like, but the composition ratio of a reaction product of the constituent elements is changed, causing the large influence of changing piezoelectric characteristics.

In order to generate larger internal stress, rare gas may be contained in as a large amount as possible over the inside of the piezoelectric thin film. However, an increase in content may decrease the withstand voltage of the piezoelectric thin film and thus degrade the characteristics of a thin film piezoelectric device due to an increase in leakage current.

Patent Literature 1 discloses that a shield film of a thin film magnetic device contains argon (Ar) as a rare gas element but is aimed at increasing the hardness of the film in order to improve workability of the shield film in a polishing step for manufacturing the device.

Patent Literature 2 discloses that a piezoelectric thin film contains a low concentration of Ar uniformly over the entire of the piezoelectric thin film in order to control the internal stress of the piezoelectric thin film.

The present invention has been achieved in consideration of the problems of the related art and an object of the invention is to provide a thin film piezoelectric device having a high coercive electric field.

In order to achieve the object, a thin film piezoelectric device according to the present invention includes a pair of electrode layers, and a piezoelectric thin film interposed between the pair of electrode layers, wherein the piezoelectric thin film contains a rare gas element and has a content gradient of the rare gas element in the thickness direction of the piezoelectric thin film. That is, the thin film piezoelectric device includes the piezoelectric thin film having a content gradient of the rare gas and the pair of electrode layers disposed with the piezoelectric thin film interposed therebetween, the content maximum lying at a desired position in the thickness direction.

Since the piezoelectric thin film contains the rare gas, internal stress can be introduced, and a coercive electric field can be increased. However, when a film simply contains a large amount of rare gas uniformly in the thickness direction as described above, a leakage path is produced in the piezoelectric thin film, thereby decreasing the withstand voltage and increasing the leakage current. Therefore, it is necessary for the piezoelectric thin film to have a rare gas content gradient.

In the thin film piezoelectric device according to the present invention, the piezoelectric thin film has the rare gas element content whose maximum preferably does not lie in either of electrode layer-side interface layers of the piezoelectric thin film. In addition the rare gas element content of the piezoelectric thin film preferably has a minimum in one of the electrode layer-side interface layers of the piezoelectric thin film. As a result, the rare gas content can be sufficiently decreased in a region on either of the pair of electrode film sides of the piezoelectric thin film, thereby suppressing the occurrence of a leakage path on the electrode layer sides.

If the direction of an electric field applied to the thin film piezoelectric device is fixed, a region having a low rare gas content may be disposed on only one of the electrode layer sides. However, when an electric field is applied in both directions, the rare gas content is more preferably low in both electrode layer-side interface layers.

Further, when the electrode layer-side interface layers contain no rare gas, the piezoelectric thin film becomes ideal from the viewpoint of impurity content, and the occurrence of a leakage path in the piezoelectric thin film can be suppressed, thereby creating a preferred state for a thin film piezoelectric device with no problem of a leakage current.

The piezoelectric thin film of the thin film piezoelectric device according to the present invention is preferably composed of a perovskite ferroelectric material which can produce higher piezoelectric characteristics. In particular, a potassium sodium niobate-based piezoelectric thin film having a lower coercive electric field than that of lead zirconate titanate (PZT) or the like is preferred.

The thin film piezoelectric device according to the present invention can be driven under a high voltage because a coercive electric field can be increased as compared with a usual thin film piezoelectric device, and a large displacement can be achieved even with a device using the inverse piezoelectric effect.

BRIEF DESCRIPTION OF DRAWINGS

FIG. 5 is a diagram illustrating argon contents in piezoelectric thin films of examples of the present invention and comparative examples.

DESCRIPTION OF EMBODIMENTS

Figure 1:
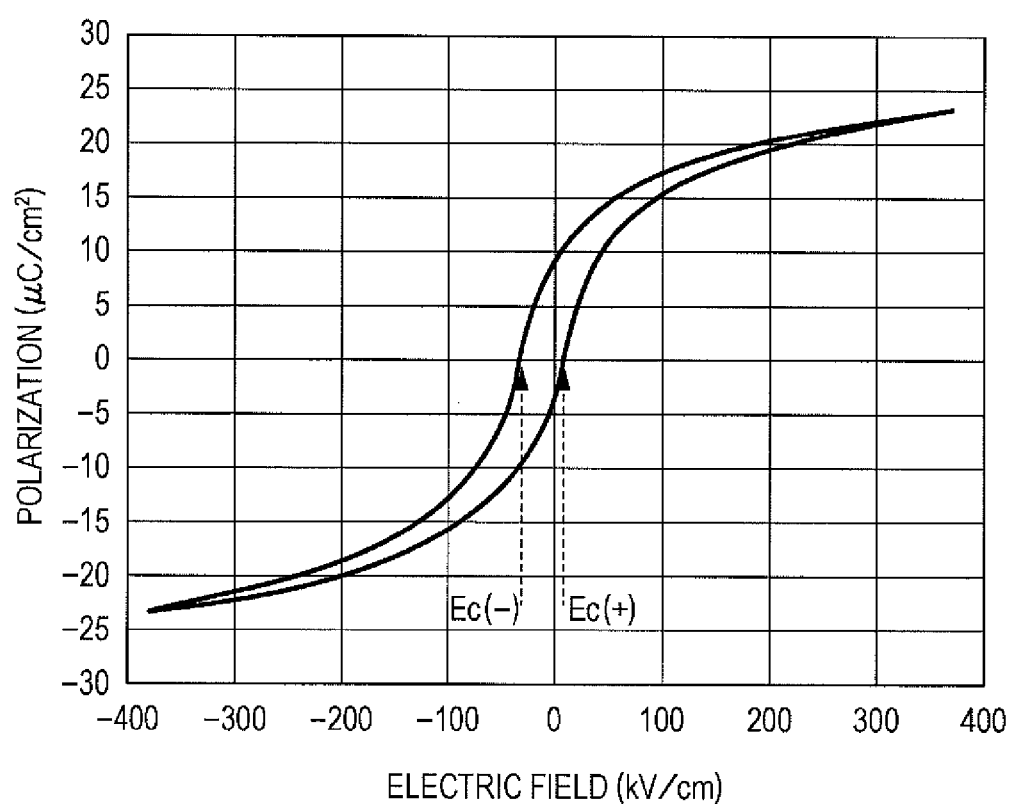
FIG. 1 is a diagram illustrating a hysteresis curve of polarization P versus electric field E of a typical piezoelectric device and positions of coercive electric field Ec.
Figure 2:
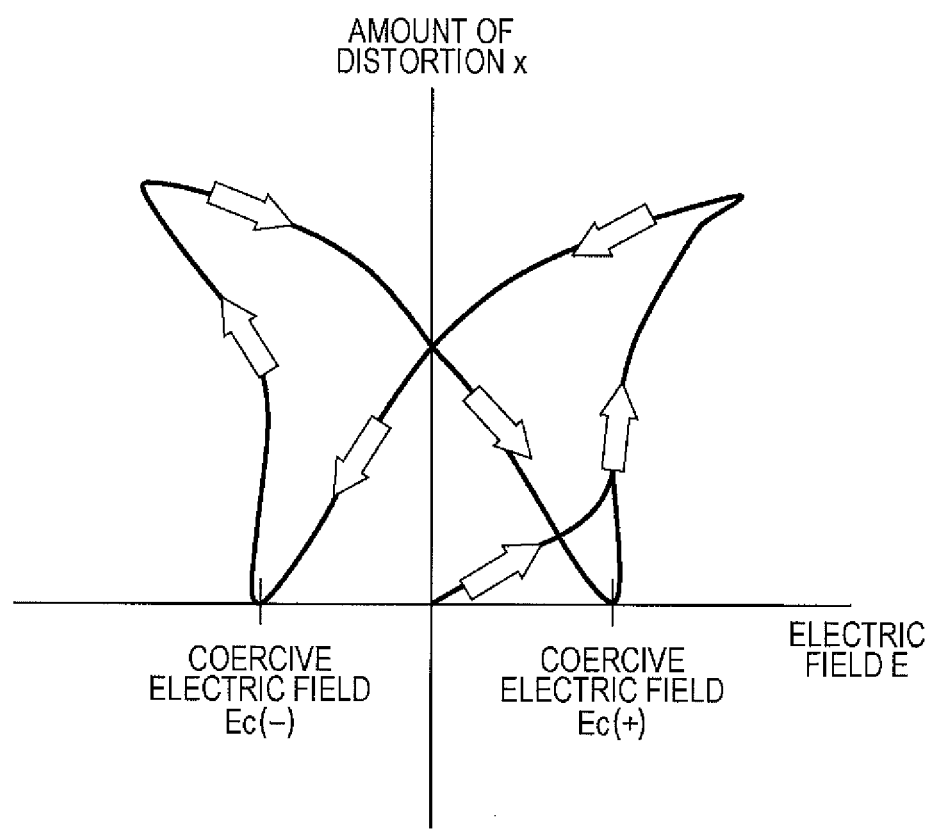
FIG. 2 is a diagram illustrating a relation (hereinafter referred to as a "butterfly curve") between the amount of distortion x and electric field E of a typical piezoelectric device.

A preferred embodiment of the present invention is described in detail below with reference to the drawings. In the drawings, the same or corresponding elements are denoted by the same reference numeral. In addition, vertical and horizontal positional relationships are as shown in the drawings. Duplicated description is omitted.

Figure 3:
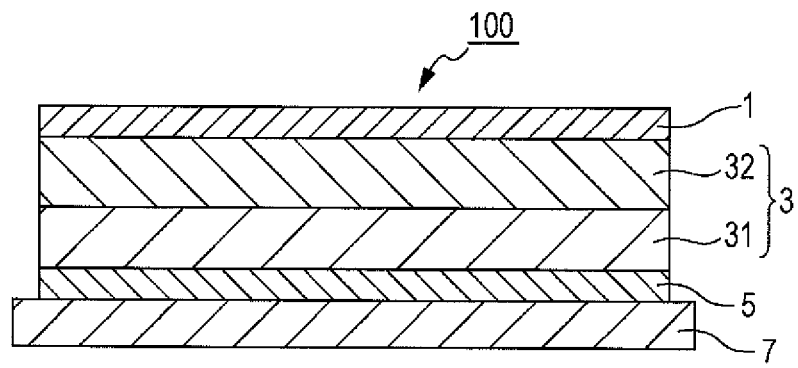
FIG. 3 is a drawing of a configuration (two piezoelectric thin films) of a thin film piezoelectric device according to an embodiment of the present invention.

FIG. 3 illustrates a thin film piezoelectric device 100 according to an embodiment of the present invention. The thin film piezoelectric device 100 includes a substrate 7, a first electrode layer 5 provided on the substrate 7, a piezoelectric thin film 3 formed on the first electrode layer 5, and a second electrode layer 1 formed on the piezoelectric thin film 3.

For example, a silicon substrate having (100) orientation can be used as the substrate 7. For example, the substrate 7 has a thickness of 200 μm or more and 1000 μm or less. Also, a silicon substrate having orientation other than the (100) orientation, a silicon-on-insulator (SOI) substrate, a quartz glass substrate, a compound semiconductor substrate composed of GaAs or the like, a sapphire substrate, a metal substrate composed of stainless or the like, a MgO substrate, a $SrTiO_3$ substrate, and the like can be used as the substrate 7. The substrate 7 may be removed after the thin film piezoelectric device is formed, and need not be included in the device.

For example, the first electrode layer 5 is composed of platinum (Pt). The first electrode layer 5 preferably has a thickness of 0.02 μm or more and 1.0 μm or less. With a thickness of less than 0.02 μm, the function as an electrode become unsatisfactory, while with a thickness exceeding 1.0 μm, the problem of inhibiting displacement of the piezoelectric material used. A Pt film formed by the sputtering method on a silicon substrate having (100) orientation and heated to about 400° C. to 500° C. is a film having high (100) orientation, and the piezoelectric thin film 3 subsequently formed on the Pt film can also be provided with high orientation. In addition, metallic materials such as palladium (Pd), rhodium (Rh), gold (Au), ruthenium (Ru), iridium (Ir), and the like can be used for the first electrode layer 5. Sputtering is preferably performed using argon (Ar) gas under a gas pressure of 0.1 to 0.5 Pa with an applied power supply output of 0.5 to 1.0 $W/cm^2$. The applied power supply may be either a high-frequency power supply or a direct-current power supply.

The piezoelectric thin film 3 is not particularly limited as long as it exhibits piezoelectric characteristics. Examples thereof include PZT (lead zirconate titanate), KNN (potassium sodium niobate), BT (barium titanate), LN (lithium niobate) BNT (bismuth sodium titanate), ZnO (zinc oxide), AlN (aluminum nitride), and the like. The thickness of the piezoelectric thin film 3 is not particularly limited and, for example, can be about 0.5 μm to 5 μm. Sputtering is preferably performed using argon-oxygen mixed $(Ar+O_2)$ gas under a gas pressure of 0.1 to 0.5 Pa. A high-frequency power supply is preferably used as the applied power supply, and its output is preferably 2.5 to 5.5 $W/cm^2$.

Among the above-described piezoelectric materials, a perovskite ferroelectric material which can produce higher piezoelectric characteristics is preferred for the piezoelectric thin film of the thin film piezoelectric device according to the present invention. In particular, a potassium sodium niobate-based piezoelectric thin film having a smaller coercive electric field than lead zirconate titanate (PZT) and the like is preferred.

The potassium sodium niobate-based piezoelectric thin film represents a film having a composition represented by a basic chemical formula $(Na_xK_{1-x})NbO_3$ (0<x 1) and, if required, containing various additives at the A site where an alkali metal is present and the B site where Nb is present. Further, the piezoelectric thin film may contain a small amount of compound other than the composition.

The piezoelectric thin film 3 contains a rare gas element at a content lower than about 15 atomic %. Although inert gases of group 18 elements, such as argon (Ar), xenon (Xe), krypton (Kr), and the like, can be used as the rare gas element, argon (Ar) is preferred in view of material cost and availability.

The piezoelectric thin film 3 preferably has a content gradient of the rare gas element in the thickness direction, and, preferably, the rare gas element content has a maximum value of about 10 to 15 atomic % and is 5 atomic % or less in an interface layer in contact with any one of the first electrode film 5 and the second electrode film 1. The gradient is not limited to either a linear gradient or a curved gradient. The minimum value of the rare gas element content (hereinafter simply referred to as the "minimum value") is preferably 40% or less of the maximum value of the rare gas element content (hereinafter simply referred to as the "maximum value"), and the maximum value preferably lies at a position of 20 to 80% relative to 100% of the distance between both electrode film interfaces in the thickness direction. The rare gas element in the piezoelectric thin film 3 is imparted with a content gradient by a method of changing the applied voltage, changing the mixed gas pressure, changing the rare gas partial pressure of the mixed gas, or the like.

With respect to the rare gas element content in the piezoelectric thin film 3, detection is performed by measuring a transmission electron microscope (TEM) image of a sectional structure of the film with an energy dispersive X-ray analyzer (EDS), and the content can be determined by measuring intensities in the thickness direction.

In order to measure the content gradient of the rare gas element in the piezoelectric thin film 3, specifically, the sectional structure of the film is divided into a plurality of thin layers (generally 20 layers or more) parallel to the electrode layer interfaces and measured. In the present invention, the interface layers refer to, among the plurality of thin layers, the thin layers closest to the electrode layers.

The rare gas element content can be determined by detecting the intensity of each of the elements including the additives, which constitute the piezoelectric thin film 3, in each of the thin layers of the piezoelectric thin film 3 and determining an atomic composition ratio from the intensity of the rare gas element and the total intensity of all elements.

The second electrode layer 1 is composed of, for example, platinum (Pt). The second electrode layer 1 has a thickness of, for example, 0.02 µm or more and 1.0 µm or less. The second electrode layer 1 can be formed by a sputtering method, and metallic materials such as palladium (Pd), rhodium (Rh), gold (Au), ruthenium (Ru), iridium (Ir), and the like can also be used.

EXAMPLES

The present invention is described in further detail below based on examples and comparative examples, but the present invention is not limited to these examples.

Example 1

FIG. 3 is a drawing illustrating a configuration of a thin film piezoelectric device 100 of Example 1.

A silicon substrate 7 having (100) orientation and a thickness of 400 µm was heated to 400° C., and Pt was deposited to 200 nm on the silicon substrate 7 by the sputtering method under epitaxial growth with the orientation of the silicon substrate 7, forming a first electrode layer 5. In this case, the deposition rate was 0.2 nm/sec.

Then, the silicon substrate 7 was heated to 550° C., and potassium sodium niobate (KNN) was epitaxially grown to 1000 nm by the sputtering method using an argon-oxygen mixed ($Ar+O_2$) gas having an oxygen ($O_2$) content of 5% under a gas pressure of 0.2 Pa, forming a first layer 31 of the piezoelectric thin film 3. A high-frequency power supply was used as the applied power supply, and the output value applied to a target of 150 mm in diameter was linearly changed from 800 W at the start of deposition to 1200 W at the end of deposition. Then, potassium sodium niobate (KNN) was epitaxially grown to 1000 nm by the sputtering method using the same gas under the same gas pressure as described above, forming a second layer 32. The applied output value was linearly changed from 1200 W at the start of deposition to 800 W at the end of deposition.

Next, Pt was deposited to 200 nm by the sputtering method at room temperature to form a second electrode layer 1. In this case, the deposition rate was 0.2 nm/sec.

After the second electrode layer 1 was formed, the piezoelectric thin film 3, the first electrode layer 5, and the second electrode layer 1 were patterned by photolithography and dry etching or wet etching, and further the silicon substrate 7 was cut to form the thin film piezoelectric device 100 of Example 1 having movable portion dimensions of 1 mm×2 mm.

Example 2

A silicon substrate 7 having (100) orientation was heated to 400° C., and Pt was deposited to 200 nm on the silicon substrate 7 by the sputtering method under epitaxial growth with the orientation of the silicon substrate 7, forming a first electrode layer 5. In this case, the deposition rate was 0.2 nm/sec.

Then, the silicon substrate 7 was heated to 550° C., and potassium sodium niobate (KNN) was epitaxially grown to 1500 nm by the sputtering method using an argon-oxygen mixed ($Ar+O_2$) gas having an oxygen ($O_2$) content of 5% under a gas pressure of 0.2 Pa, forming a first layer 31 of the piezoelectric thin film 3. A high-frequency power supply was used as the applied power supply, and the output value applied to a target of 150 mm in diameter was linearly changed from 800 W at the start of deposition to 1200 W at the end of deposition. Then, potassium sodium niobate (KNN) was epitaxially grown to 500 nm by the sputtering method using the same gas under the same gas pressure as described above, forming a second layer 32. The applied output value was linearly changed from 1200 W at the start of deposition to 1000 W at the end of deposition.

Next, Pt was deposited to 200 nm by the sputtering method at room temperature to form a second electrode layer 1. In this case, the deposition rate was 0.2 nm/sec.

After the second electrode layer 1 was formed, the piezoelectric thin film 3, the first electrode layer 5, and the second electrode layer 1 were patterned by photolithography and dry etching or wet etching, and further the silicon substrate 7 was cut to form the thin film piezoelectric device 100 of Example 2 having movable portion dimensions of 1 mm×2 mm.

Example 3

In Example 3, the piezoelectric thin film 3 shown in FIG. 3 included one layer. A silicon substrate 7 having (100) orientation was heated to 400° C., and Pt was deposited to 200 nm on the silicon substrate 7 by the sputtering method under epitaxial growth with the orientation of the silicon substrate 7, forming a first electrode layer 5. In this case, the deposition rate was 0.2 nm/sec.

Then, the silicon substrate 7 was heated to 550° C., and potassium sodium niobate (KNN) was epitaxially grown to 2000 nm by the sputtering method using an argon-oxygen mixed (Ar+$O_2$) gas having an oxygen ($O_2$) content of 5% under a gas pressure of 0.2 Pa, forming the piezoelectric thin film 3. A high-frequency power supply was used as the applied power supply, and the output value applied to a target of 150 mm in diameter was linearly changed from 800 W at the start of deposition to 1200 W at the end of deposition.

Next, Pt was deposited to 200 nm by the sputtering method at room temperature to form a second electrode layer 1. In this case, the deposition rate was 0.2 nm/sec.

After the second electrode layer 1 was formed, the piezoelectric thin film 3, the first electrode layer 5, and the second electrode layer 1 were patterned by photolithography and dry etching or wet etching, and further the silicon substrate 7 was cut to form the thin film piezoelectric device 100 of Example 3 having movable portion dimensions of 1 mm×2 mm.

Example 4

Figure 4:
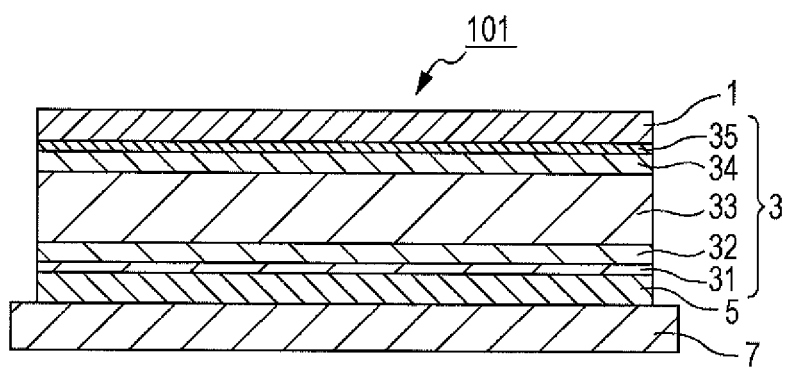
FIG. 4 is a drawing of a configuration (five piezoelectric thin films) of a thin film piezoelectric device according to another embodiment of the present invention.

FIG. 4 is a drawing illustrating a configuration of a thin film piezoelectric device 101 of Example 4 of the present invention. In Example 4, a piezoelectric thin film 3 included five layers.

A silicon substrate 7 having (100) orientation was heated to 400° C., and Pt was deposited to 200 nm on the silicon substrate 7 by the sputtering method under epitaxial growth with the orientation of the silicon substrate 7, forming a first electrode layer 5. In this case, the deposition rate was 0.2 nm/sec.

Then, the silicon substrate 7 was heated to 550° C., and potassium sodium niobate (KNN) was epitaxially grown to 100 nm by the sputtering method using an argon-oxygen mixed (Ar+$O_2$) gas having an oxygen ($O_2$) content of 5% under a gas pressure of 0.2 Pa and using a high-frequency power supply with an output value of 600 W applied to a target of 150 mm in diameter, forming a first layer 31 of the piezoelectric thin film 3. Then, potassium sodium niobate (KNN) was epitaxially grown to 400 nm by the sputtering method using the same gas under the same gas pressure as described above, forming a second layer 32. The output value applied was linearly changed from 600 W at the start of deposition to 1200 W at the end of deposition. Then, potassium sodium niobate (KNN) was epitaxially grown to 1000 nm by the sputtering method using the same gas under the same gas pressure as described above with an output value of 1200 W, forming a third layer 33. Then, potassium sodium niobate (KNN) was epitaxially grown to 400 nm by the sputtering method using the same gas under the same gas pressure as described above, forming a fourth layer 34. The output value applied was linearly changed from 1200 W at the start of deposition to 600 W at the end of deposition. Then, potassium sodium niobate (KNN) was epitaxially grown to 100 nm by the sputtering method using the same gas under the same gas pressure as described above with an output value of 600 W, forming a fifth layer 35.

Next, Pt was deposited to 200 nm by the sputtering method at room temperature to form a second electrode layer 1. In this case, the deposition rate was 0.2 nm/sec.

After the second electrode layer 1 was formed, the piezoelectric thin film 3, the first electrode layer 5, and the second electrode layer 1 were patterned by photolithography and dry etching or wet etching, and further the silicon substrate 7 was cut to form the thin film piezoelectric device 101 of Example 4 having movable portion dimensions of 1 mm×2 mm.

Example 5

In Example 5, the piezoelectric thin film 3 shown in FIG. 4 included three layers.

A silicon substrate 7 having (100) orientation was heated to 400° C., and Pt was deposited to 200 nm on the silicon substrate 7 by the sputtering method under epitaxial growth with the orientation of the silicon substrate 7, forming a first electrode layer 5. In this case, the deposition rate was 0.2 nm/sec.

Then, the silicon substrate 7 was heated to 550° C., and potassium sodium niobate (KNN) was epitaxially grown to 500 nm by the sputtering method using an argon-oxygen mixed (Ar+$O_2$) gas having an oxygen ($O_2$) content of 5% under a gas pressure of 0.1 Pa, forming a first layer 31 of the piezoelectric thin film 3. Then, potassium sodium niobate (KNN) was epitaxially grown to 1000 nm by the sputtering method using an argon-oxygen mixed (Ar+$O_2$) gas having an oxygen ($O_2$) content of 0.5% under a gas pressure of 1.0 Pa, forming a second layer 32. Then, potassium sodium niobate (KNN) was epitaxially grown to 500 nm by the sputtering method using an argon-oxygen mixed (Ar+$O_2$) gas having an oxygen ($O_2$) content of 5% under a gas pressure of 0.1 Pa, forming a third layer 33. A high-frequency power supply was used as the applied power supply, and the output value applied to a target of 150 mm in diameter was constant at 800 W for the first layer 31 to the third layer 33.

Next, Pt was deposited to 200 nm by the sputtering method at room temperature to form a second electrode layer 1. In this case, the deposition rate was 0.2 nm/sec.

After the second electrode layer 1 was formed, the piezoelectric thin film 3, the first electrode layer 5, and the second electrode layer 1 were patterned by photolithography and dry etching or wet etching, and further the silicon substrate 7 was cut to form the thin film piezoelectric device 101 of Example 5 having movable portion dimensions of 1 mm×2 mm.

Comparative Example 1

In Comparative Example 1, a thin film piezoelectric device was manufactured by the same method as in Example 1 except that the piezoelectric thin film 3 was deposited to 2000 nm with an applied power supply output kept contact at 600 W.

Comparative Example 2

In Comparative Example 2, a thin film piezoelectric device was manufactured by the same method as in Example 1 except that the piezoelectric thin film 3 was deposited to 2000 nm with an applied power supply output kept contact at 800 W.

Comparative Example 3

In Comparative Example 3, a thin film piezoelectric device was manufactured by the same method as in Example 1 except that the piezoelectric thin film 3 was deposited to 2000 nm with an applied power supply output kept contact at 1000 W.

Comparative Example 4

In Comparative Example 4, a thin film piezoelectric device was manufactured by the same method as in Example 1 except that the piezoelectric thin film 3 was deposited to 2000 nm with an applied power supply output kept contact at 1200 W.

FIG. 5 shows the results of measurement of the argon (Ar) content in the thickness direction of the piezoelectric thin film 3 in the thin film piezoelectric device 100 manufactured in each of Examples 1 to 5 and Comparative Examples 1 to 4. It can be confirmed that the argon (Ar) content changes according to the output values of the applied power supply, and the content is close to 0% with 600 W.

The thin film piezoelectric device of each of Examples 1 to 5 and Comparative Examples 1 to 4 was fixed to a stainless thin sheet having a thickness of 18 μm and flexible cable wiring, and then current was applied to the thin film piezoelectric device at an applied voltage of 120 Hz±127 kV/cm to measure coercive electric field Ec and leakage current density. The results of measurement are shown in Table 1.

TABLE 1

|  | Coercive electric field Vc [V] | Leakage current density I [A/cm$^2$] |
|---|---|---|
| Example 1 | −65 | $6 \times 10^{-8}$ |
| Example 2 | −61 | $1 \times 10^{-8}$ |
| Example 3 | −55 | $8 \times 10^{-7}$ |
| Example 4 | −75 | $7 \times 10^{-9}$ |
| Example 5 | −52 | $6 \times 10^{-8}$ |
| Comparative Example 1 | −6 | $8 \times 10^{-9}$ |
| Comparative Example 2 | −10 | $4 \times 10^{-5}$ |
| Comparative Example 3 | −50 | $5 \times 10^{-5}$ |
| Comparative Example 4 | −85 | $4 \times 10^{-3}$ |

In view of the output values of the applied power supply in the thin film piezoelectric devices including the piezoelectric thin films without an argon (Ar) content gradient in Comparative Examples 1 to 4, it can be confirmed that each time the output value is increased, the coercive electric field Vc is increased due to an increase in argon content. However, the leakage current density is increased due to an increase in argon content, and it is thus considered that argon (Ar) serving as impurity causes a leakage path between the electrodes. Therefore, the thin film piezoelectric devices of Comparative Examples 1 and 2 are unsatisfactory in value of coercive electric field Vc, and the thin film piezoelectric devices of Comparative Examples 3 and 4 are unsatisfactory in leakage current density. The coercive electric field Vc is obtained directly from a measuring device and is converted to a value per unit thickness of the piezoelectric thin film to determine coercive electric field Ec.

The thin film piezoelectric device of Example 1 has, in the electrode layer-side interface layers, argon contents equal to that in Comparative Example 2 and exhibits a leakage current density similar to that in Comparative Example 2, but a large coercive electric field sufficient for practical application can be produced by providing a central portion of the thickness with an argon content similar to that in Comparative Example 4.

The thin film piezoelectric device of Example 2 has, in the opposed first and second electrode layer-side interface layers, argon contents equal to those in Comparative Examples 2 and 3, respectively, and thus exhibits a leakage current density which is a medium between both comparative examples. However, like in Example 1, a large coercive electric field sufficient for practical application can be produced by providing an argon (Ar) content similar to Comparative Example 4 in the film.

Like in Example 2, the thin film piezoelectric device of Example 3 has, in the first electrode layer-side interface layer, an argon (Ar) content equal to that in Comparative Example 2 and has, in the opposite second electrode layer-side interface layer, an argon content similar to that in Comparative Example 4. Therefore, a deficiency possibly becoming a leakage path is produced on the second electrode layer side, thereby slightly decreasing the leakage current characteristic as compared with Examples 1 and 2. However, in Example 3, an increase in coercive electric field due to an increase in argon (Ar) content can be sufficiently confirmed.

The thin film piezoelectric device of Example 4 has, in the first and second electrode layer-side interface layers, argon contents similar to those in Comparative Example 1, and thus exhibits a very good leakage current characteristic. In addition, it is considered that in Example 4, a large coercive electric field can be produced in the piezoelectric thin film due to an increase in a region having the same argon (Ar) content as in Comparative Example 4.

The thin film piezoelectric device of Example 5 has, in the first and second electrode layer-side interface layers, argon contents similar to those in Comparative Example 2, and thus exhibits the result of good leakage current characteristic equal to Comparative Example 2. In addition, it is considered that in Example 5, ionization of argon molecules in plasma is promoted by an increase in argon (Ar) partial pressure, thereby increasing the Ar content and resulting in an increase in coercive electric field.

In the examples and comparative examples, the coercive electric field can be increased by adding argon (Ar) as a rare gas element to the piezoelectric thin film, and the leakage current characteristic can be improved by imparting a content gradient to the piezoelectric thin film so that the content is low on the electrode layer sides and high near the center of the piezoelectric thin film. Therefore, it was confirmed that the present invention has the effect of improving piezoelectric characteristics of a thin film piezoelectric device.

In addition, a piezoelectric thin film practical as a thin film piezoelectric device has a coercive electric field Vc of −15 V or less, and in each of the examples of the present invention, the coercive electric field Ec corresponds to −75 kV/cm or less. Further, a practical leakage current density is $1.0 \times 10^{-6}$ A/cm$^2$ or less, and it can be confirmed that the piezoelectric thin films produced in Examples 1 to 5 are practical with respect to both the coercive electric field and leakage current characteristic.

The invention claimed is:

1. A thin film piezoelectric device comprising a pair of electrode layers and a piezoelectric thin film interposed between the pair of electrode layers, wherein the piezoelectric thin film contains a rare gas element and has a content gradient of the rare gas element in the thickness direction of the piezoelectric thin film.

2. The thin film piezoelectric device according to claim 1, wherein the piezoelectric thin film includes a plurality of layers and the content maximum of the rare gas element in the piezoelectric thin film lies in layers other than either of electrode layer-side interface layers of the piezoelectric thin film.

3. The thin film piezoelectric device according to claim 1, wherein the piezoelectric thin film includes a plurality of layers and the content minimum of the rare gas element in the piezoelectric thin film lies in either of electrode layer-side interface layers of the piezoelectric thin film.

4. The thin film piezoelectric device according to claim 1, wherein the piezoelectric thin film includes a plurality of layers and at least one of electrode layer-side interface layers does not contain the rare gas element.

5. The thin film piezoelectric device according to claim 1, wherein the piezoelectric thin film is composed of a perovskite ferroelectric material.

6. The thin film piezoelectric device according to claim 1, wherein the piezoelectric thin film is a potassium sodium niobate-based thin film.

* * * * *